(12) United States Patent
Kajiwara et al.

(10) Patent No.: US 10,644,143 B2
(45) Date of Patent: May 5, 2020

(54) SEMICONDUCTOR DEVICE

(71) Applicants: KABUSHIKI KAISHA TOSHIBA, Minato-ku (JP); TOSHIBA ELECTRONIC DEVICES & STORAGE CORPORATION, Minato-ku (JP)

(72) Inventors: Yosuke Kajiwara, Yokohama (JP); Aya Shindome, Yokohama (JP); Masahiko Kuraguchi, Yokohama (JP)

(73) Assignees: KABUSHIKI KAISHA TOSHIBA, Minato-ku (JP); TOSHIBA ELECTRONIC DEVICES & STORAGE CORPORATION, Minato-ku (JP)

( * ) Notice: Subject to any disclaimer, the term of this patent is extended or adjusted under 35 U.S.C. 154(b) by 0 days.

(21) Appl. No.: 16/284,237

(22) Filed: Feb. 25, 2019

(65) Prior Publication Data
US 2019/0371927 A1 Dec. 5, 2019

(30) Foreign Application Priority Data
May 29, 2018 (JP) .................. 2018-102439

(51) Int. Cl.
*H01L 29/778* (2006.01)
*H01L 29/10* (2006.01)

(52) U.S. Cl.
CPC ...... *H01L 29/7786* (2013.01); *H01L 29/1033* (2013.01)

(58) Field of Classification Search
CPC ............ H01L 29/7786; H01L 29/1033; H01L 29/1037
(Continued)

(56) References Cited

U.S. PATENT DOCUMENTS

| 10,256,100 B2 * | 4/2019 | Hirai ................. H01L 21/28114 |
| 2007/0045670 A1 * | 3/2007 | Kuraguchi ............ H01L 29/407 257/249 |

(Continued)

FOREIGN PATENT DOCUMENTS

| JP | 2016-111288 | 6/2016 |
| JP | 2016-157801 | 9/2016 |
| JP | 2017-10989 | 1/2017 |

*Primary Examiner* — Dao H Nguyen
(74) *Attorney, Agent, or Firm* — Oblon, McClelland, Maier & Neustadt, L.L.P.

(57) ABSTRACT

According to one embodiment, a semiconductor device includes first and second semiconductor layers, first, second, and third electrodes, and first and second insulating portions. The first semiconductor layer includes first, second, and third semiconductor regions. The second semiconductor layer includes first to sixth partial regions. The first electrode is electrically connected to the first partial region. The second electrode is electrically connected to the second partial region. A position of the third electrode is between positions of the first and second electrodes in a second direction. A first direction crosses the second direction from the first to second semiconductor regions. The first insulating portion is provided between the third semiconductor region and the third electrode and between the third partial region and the third electrode in the first direction. The fourth partial region is between the second insulating portion and the second semiconductor region in the first direction.

16 Claims, 8 Drawing Sheets

(58) Field of Classification Search
USPC ...... 257/192, 194, 201, 249, 43, 76, E21.09,
257/E21.403, E21.407, E29.091, E29.1,
257/E29.188, E29.246, E29.253, E29.315;
438/104, 172, 270, 478
See application file for complete search history.

(56) References Cited

U.S. PATENT DOCUMENTS

| | | | |
|---|---|---|---|
| 2010/0090225 A1* | 4/2010 | Sato | H01L 29/41766 257/76 |
| 2010/0314663 A1* | 12/2010 | Ito | H01L 29/1083 257/192 |
| 2014/0084300 A1* | 3/2014 | Okamoto | H01L 29/4236 257/76 |
| 2016/0172474 A1* | 6/2016 | Miyake | H01L 29/7783 257/76 |

* cited by examiner

SEMICONDUCTOR DEVICE

CROSS-REFERENCE TO RELATED APPLICATIONS

This application is based upon and claims the benefit of priority from Japanese Patent Application No. 2018-102439, filed on May 29, 2018; the entire contents of which are incorporated herein by reference.

FIELD

Embodiments described herein relate generally to a semiconductor device.

BACKGROUND

There is a semiconductor device including gallium and nitrogen. Regarding semiconductor devices, reduction in current collapse is requested.

DETAILED DESCRIPTION

Figure 1:
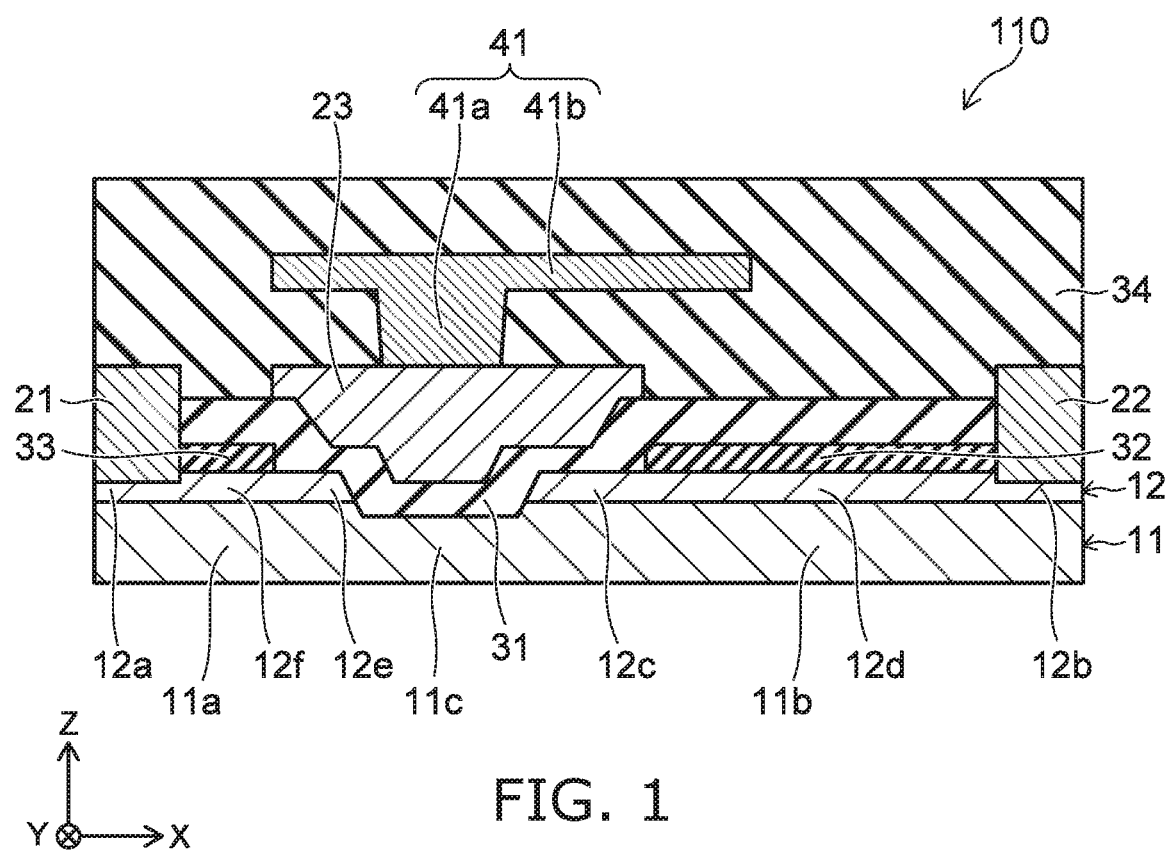
FIG. 1 is a cross-sectional view schematically illustrating a semiconductor device according to an embodiment.

According to one embodiment, a semiconductor device includes a first semiconductor layer, a second semiconductor layer, a first electrode, a second electrode, a third electrode, a first insulating portion, and a second insulating portion. The first semiconductor layer includes $Al_{x1}Ga_{1-x1}N$ ($0 \leq x1 < 1$). The first semiconductor layer includes a first semiconductor region, a second semiconductor region, and a third semiconductor region between the first semiconductor region and the second semiconductor region. The second semiconductor layer includes $Al_{x2}Ga_{1-x2}N$ ($0 < x2 < 1$, $x1 < x2$). The second semiconductor layer includes a first partial region, a second partial region, a third partial region between the first partial region and the second partial region, a fourth partial region between the second partial region and the third partial region, a fifth partial region between the first partial region and the third partial region, and a sixth partial region between the first partial region and the fifth partial region. The first partial region, the fifth partial region, and the sixth partial region overlap the first semiconductor region in a first direction crossing a second direction from the first semiconductor region to the second semiconductor region. The second partial region, the third partial region, and the fourth partial region overlap the second semiconductor region in the first direction. The first electrode is electrically connected to the first partial region. The second electrode is electrically connected to the second partial region. A direction from the first electrode to the second electrode is along the second direction. A position in the second direction of the third electrode is between a position in the second direction of the first electrode and a position in the second direction of the second electrode. The first insulating portion is provided between the third semiconductor region and the third electrode and between the third partial region and the third electrode in the first direction. The fourth partial region is between the second insulating portion and the second semiconductor region in the first direction. The fourth partial region does not overlap the third partial region in the first direction.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

FIG. 1 is a cross-sectional view schematically illustrating a semiconductor device according to an embodiment.

As shown in FIG. 1, the semiconductor device 110 according to the embodiment includes: a first semiconductor layer 11, a second semiconductor layer 12, a first electrode 21, a second electrode 22, a third electrode 23, a first insulating portion 31, a second insulating portion 32, and a third insulating portion 33.

The first semiconductor layer 11 includes a first semiconductor region 11a, a second semiconductor region 11b, and a third semiconductor region 11c. The third semiconductor region 11c is positioned between the first semiconductor region 11a and the second semiconductor region 11b.

The direction from the first semiconductor region 11a toward the second semiconductor region 11b is defined as a second direction. The second direction is along, for example, the X-axis direction shown in FIG. 1. One direction perpendicular to the X-axis direction is defined as the Y-axis direction. The direction perpendicular to the X-axis direction and the Y-axis direction is defined as the Z-axis direction. The direction that crosses the second direction is defined as a first direction. The first direction is along, for example, the Z-axis direction. The direction that crosses the first direction and the second direction is defined as a third direction. The third direction is along the Y-axis direction, for example.

Hereinafter, the case where the first direction, the second direction, and the third direction are respectively along the Z-axis direction, the X-axis direction, and the Y-axis direction will be described.

The second semiconductor layer 12 includes a first partial region 12a, a second partial region 12b, a third partial region 12c, a fourth partial region 12d, a fifth partial region 12e, and a sixth partial region 12f. The third partial region 12c is between the first partial region 12a and the second partial region 12b. The fourth partial region 12d is between the second partial region 12b and the third partial region 12c. The fifth partial region 12e is between the first partial region 12a and the third partial region 12c. The sixth partial region 12f is between the first partial region 12a and the fifth partial region 12e. The first partial region 12a, the fifth partial region 12e, and the sixth partial region 12f overlap the first semiconductor region 11a in the Z-axis direction. The second partial region 12b, the third partial region 12c, and the fourth partial region 12d overlap the second semiconductor region 11b in the Z-axis direction. The direction from the first partial region 12a to the second partial region 12b is along the X-axis direction.

The first electrode 21 is electrically connected to the first partial region 12a. The first partial region 12a is between the first semiconductor region 11a and the first electrode 21 in the Z-axis direction.

The second electrode 22 is electrically connected to the second partial region 12b. The second partial region 12b is between the second semiconductor region 11b and the second electrode 22 in the Z-axis direction. The direction from the first electrode 21 to the second electrode 22 is along the X-axis direction The position in the X-axis direction of the third electrode 23 is between the position in the X-axis direction of the first electrode 21 and the position in the X-axis direction of the second electrode 22. For example, the third electrode 23 is provided between the first electrode 21 and the second electrode 22 in the X-axis direction. In addition, the direction from the third semiconductor region 11c to the third electrode 23 is along the Z-axis direction.

In the Z-axis direction, the first insulating portion 31 is provided between the third semiconductor region 11c and the third electrode 23, between the third partial region 12c and the third electrode 23, and between the fifth partial region 12e and the third electrode 23. Furthermore, the first insulating portion 31 may overlap the second insulating portion 32 and the third insulating portion 33 in the Z-axis direction.

The fourth partial region 12d is between the second insulating portion 32 and the second semiconductor region 11b in the Z-axis direction. The second insulating portion 32 does not overlap the third partial region 12c in the Z-axis direction. The second insulating portion 32 is not provided between the third partial region 12c and the third electrode 23 in the Z-axis direction.

The sixth partial region 12f is between the third insulating portion 33 and the first semiconductor region 11a in the Z-axis direction. The third insulating portion 33 does not overlap the fifth partial region 12e in the Z-axis direction. The third insulating portion 33 is not provided between the fifth partial region 12e and the third electrode 23 in the Z-axis direction.

In the example shown in FIG. 1, the semiconductor device 110 further includes a fourth insulating portion 34 and a first conductive portion 41. The first conductive portion 41 is electrically connected to the third electrode 23. The third electrode 23 is positioned between the third semiconductor region 11c and the first conductive portion 41 in the Z-axis direction.

The first conductive portion 41 includes, for example, a first conductive region 41a and a second conductive region 41b. The first conductive region 41a is between the third electrode 23 and the second conductive region 41b in the Z-axis direction. The length in the X-axis direction of the first conductive region 41a is shorter than the length in the X-axis direction of the second conductive region 41b and shorter than the length in the X-axis direction of the third electrode 23. The second conductive region 41b is connected to the third electrode 23 and the first conductive region 41a. The direction from a part of the second insulating portion 32 to a part of the second conductive region 41b is along the Z-axis direction.

A part of the fourth insulating portion 34 is provided around the first conductive region 41a and the second conductive region 41b along the plane including the X-axis direction and the Y-axis direction. The first electrode 21, the second electrode 22, the third electrode 23, and the first insulating portion 31 are between the first semiconductor layer 11 and the fourth insulating portion 34 in the Z-axis direction.

The first semiconductor layer 11 includes $Al_{x1}Ga_{1-x1}N$ ($0 \le x1 < 1$). The first semiconductor layer 11 includes, for example, gallium nitride. The second semiconductor layer 12 includes $Al_{x2}Ga_{1-x2}N$ ($0 < x2 < 1$, $x1 < x2$). The second semiconductor layer 12 includes, for example, aluminum gallium nitride.

The first electrode 21 and the second electrode 22 include, for example, at least one selected from the group consisting of titanium and aluminum. The third electrode 23 includes, for example, at least one selected from the group consisting of titanium, tungsten, and molybdenum, and nitrogen.

Alternatively, the third electrode 23 includes at least one selected from the group consisting of nickel and aluminum. The first conductive portion 41 includes, for example, at least one selected from the group consisting of titanium, gold, platinum, copper, and aluminum.

The first insulating portion 31 includes, for example, at least one selected from the group consisting of oxygen and nitrogen, and any one of silicon and aluminum. The second insulating portion 32 and the third insulating portion 33 include, for example, at least one selected from the group consisting of silicon and aluminum, and nitrogen. The second insulating portion 32 and the third insulating portion 33 may further include oxygen. The fourth insulating portion 34 includes at least one selected from the group consisting of oxygen and nitrogen, and silicon.

For example, the material included in the first insulating portion 31 is different from the material included in the second insulating portion 32 and the third insulating portion 33. The first insulating portion 31 includes, for example, at least one selected from the group consisting of silicon oxide and aluminum oxide. The first insulating portion 31 may include aluminum oxynitride.

The second insulating portion 32 and the third insulating portion 33 include, for example, at least one selected from the group consisting of silicon nitride, silicon oxynitride, aluminum nitride, and aluminum oxynitride.

For example, the material included in the fourth insulating portion 34 is different from the material included in the first insulating portion 31. The material included in the fourth insulating portion 34 may be the same as the material included in the first insulating portion 31. In addition, the fourth insulating portion 34 may include not less than two different materials. For example, the fourth insulating portion 34 may be a stacked structure in which not less than two layers are stacked in the Z-axis direction. For example, in the stacked structure, the materials included in the respective layers are different from each other.

The first electrode 21 functions as, for example, a source electrode. The second electrode 22 functions as, for example, a drain electrode. The first insulating portion 31 functions as a gate insulating layer. The third electrode 23 in contact with the first insulating portion 31 functions as a gate electrode. The first conductive portion 41 functions as a field plate electrode for mitigating electric field intensity near the third electrode 23.

Two-dimensional electron gas is generated near the interface between the first semiconductor layer 11 and the second semiconductor layer 12. The potential of the third electrode 23 is set to be not less than the threshold value, in a state where the potential of the second electrode 22 is set to a value larger than the potential of the first electrode 21. Thus, a channel is formed near the interface between the third semiconductor region 11c and the first insulating portion 31. Electrons flow through the channel from the first electrode 21 toward the second electrode 22, and the semiconductor device 110 is brought into an ON state.

In the semiconductor device 110, applying a large potential to the second electrode 22 may increase the on-resistance. This phenomenon is referred to as current collapse. The generation mechanism of current collapse is, for example, as follows. The electrons in the two-dimensional electron gas are accelerated by the high potential. The accelerated electrons are captured at the surface defect level of the second semiconductor layer 12. A part of the second semiconductor layer 12 is negatively charged. The electrons in the two-dimensional electron gas positioned immediately under the portion of the second semiconductor layer 12 are depleted, and the on-resistance increases. In order to suppress the increase in the on-resistance, the current collapse is desirably small.

Figure 2A:
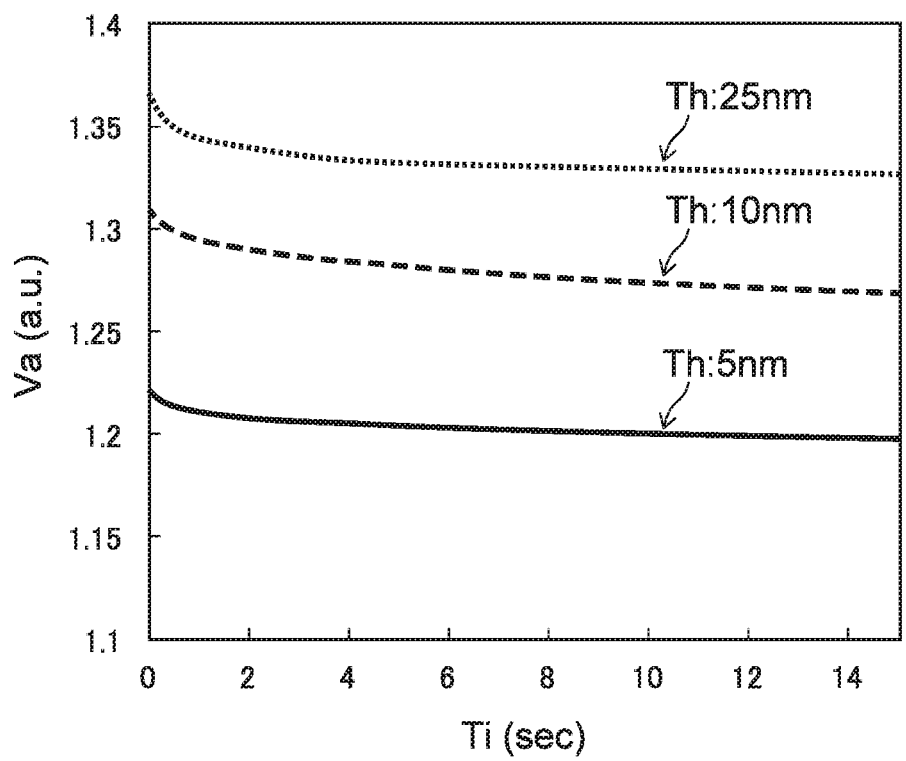
FIG. 2A and FIG. 2B are graphs illustrating the characteristics of the semiconductor device.
Figure 2B:
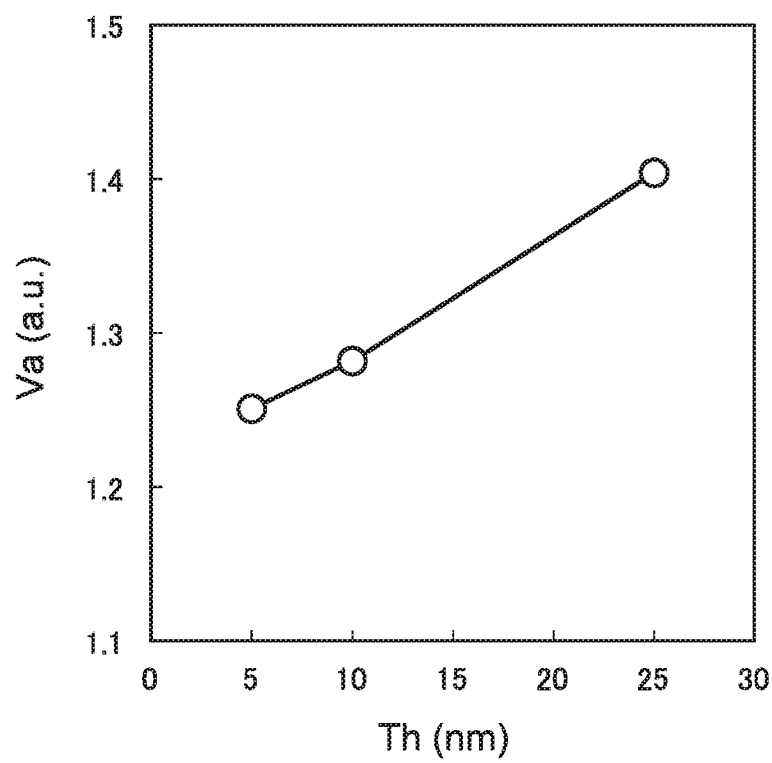
Figure 3:
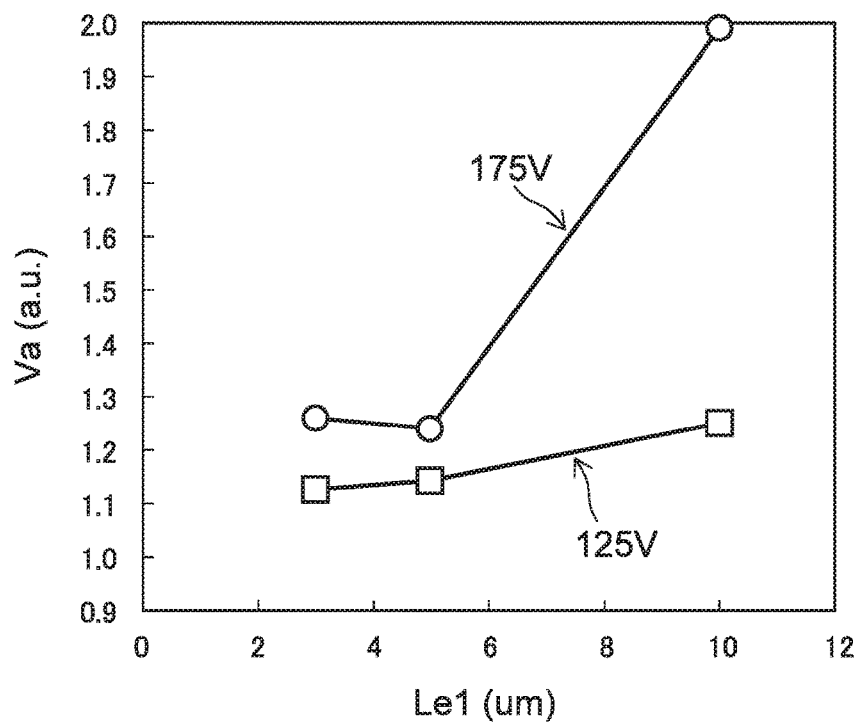
FIG. 3 is a graph illustrating the characteristics of the semiconductor device.

FIG. 2A, FIG. 2B, and FIG. 3 are graphs illustrating the characteristics of the semiconductor device.

FIG. 2A and FIG. 2B show experimental results of a semiconductor device according to a reference example. In the semiconductor device 110 according to the embodiment, the fourth partial region 12d overlaps the second insulating portion 32 in the Z-axis direction, and the third partial region 12c does not overlap the second insulating portion 32 in the Z-axis direction. In the semiconductor device according to the reference example, the fourth partial region 12d and the third partial region 12c overlap the second insulating portion 32 in the Z-axis direction. That is, in the semiconductor device 110 according to the embodiment, the second insulating portion 32 is not provided between the third partial region 12c and the third electrode 23, but in the semiconductor device according to the reference example, the second insulating portion 32 is provided between the third partial region 12c and the third electrode 23.

Three types of semiconductor devices according to the reference example (first semiconductor device to third semiconductor device, respectively) were prepared. In the first semiconductor device, the thickness Th in the Z-axis direction (length in the Z-axis direction) of the second insulating portion 32 is 25 nm. In the second semiconductor device, the thickness Th is 10 nm. In the third semiconductor device, the thickness Th is 5 nm.

The on-resistance of the first semiconductor device to the third semiconductor device was measured. Specifically, with the potential of the first electrode 21 being set to 0 V and in a state of the potential of 1 V being applied to the second electrode 22, the potential of the third electrode 23 was set to be not less than a threshold value, and the electrical resistance (on-resistance) between the first electrode 21 and the second electrode 22 was measured under the following conditions.

In the first semiconductor device to the third semiconductor device, first, a stress potential of 175 V was applied to the second electrode 22. This state was continued for a predetermined time. Thereafter, the potential of the second electrode 22 was set to 1 V. In this state, the potential of the third electrode 23 was set to be not less than the threshold value, and the on-resistance was measured.

In FIG. 2A, the horizontal axis represents the time Ti (second) elapsed from the end of the application of the stress potential to the second electrode 22. The vertical axis represents the value Va obtained by dividing the on-resistance after applying the stress potential to the second electrode 22 by the on-resistance before applying the stress potential. The results of the dotted line, the broken line, and the solid line respectively represent the relationships between the time Ti and the value Va of the first semiconductor device, the second semiconductor device, and the third semiconductor device.

From the result in FIG. 2A, it can be seen that the smaller the thickness Th, the smaller the value Va. The fact that the value Va is small indicates that the difference between the on-resistance after applying the stress potential to the second electrode 22 and the on-resistance before applying the stress potential is small. This indicates that the current collapse is small.

FIG. 2B is a graph prepared based on the experimental result in FIG. 2A. In FIG. 2B, the horizontal axis represents the thickness Th (nm). The vertical axis represents the value Va. The graph shown in FIG. 2B is based on the result 5 seconds after the application of the potential to the second electrode 22 is stopped. In FIG. 2B, an average value obtained by measuring the value Va five times is shown. From the result in FIG. 2B, it can be seen that the smaller the thickness Th, the smaller the value Va.

In the semiconductor device 110 according to the embodiment, the second insulating portion 32 does not overlap the third partial region 12c in the Z-axis direction. The second insulating portion 32 is not provided between the second semiconductor layer 12 and the third electrode 23. That is, between the second semiconductor layer 12 and the third electrode 23, the thickness of the second insulating portion 32 is zero. Thus, the value Va can be reduced. That is, the current collapse of the semiconductor device 110 can be reduced. On the other hand, the second insulating portion 32 overlaps the fourth partial region 12d in the Z-axis direction. Thus, the surface of the fourth partial region 12d is protected by the second insulating portion 32. It is possible to suppress a drop in the breakdown voltage of the semiconductor device 110 due to impurities spreading from the second semiconductor layer 12 to the first insulating portion 31 and the like.

In FIG. 3, the horizontal axis represents the length in the X-axis direction of the third partial region 12c (hereinafter referred to as a length Le1). The vertical axis represents the value Va. The calculation method of the value Va is the same as the method in the experiment related to FIG. 2A. In FIG. 3, the circle plot indicates the result when the potential of the second electrode 22 is set to 175 V and the potential is applied for a predetermined time. The square plot indicates the result when the potential of the second electrode 22 is set to 125 V and the potential is applied for a predetermined time. It should be noted that the results are values when the distance from the third electrode 23 to the second electrode 22 is 14 μm.

From the results in FIG. 3, it is found that the value Va is remarkably small when the length Le1 is not more than 5.0 μm. The length Le1 is desirably not more than 5.0 μm. On the other hand, when the length Le1 is too short, the operation of the semiconductor device 110 may be unstable. In order to stabilize the operation and to reduce the current collapse, the length Le1 is desirably not less than 0.5 μm and not more than 5.0 μm. Alternatively, the length Le1 is desirably not less than 0.035 times and not more than 0.55 times the length in the X-axis direction of the fourth partial region 12d.

Figure 4:
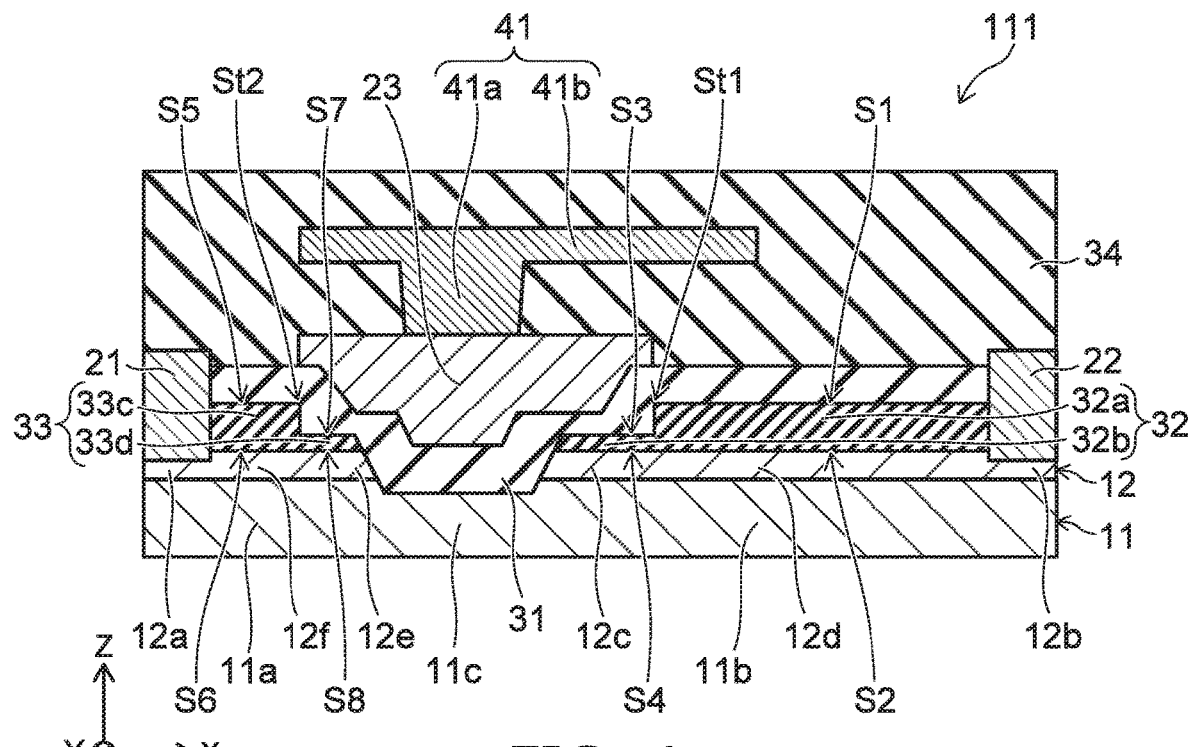
FIG. 4 is a cross-sectional view schematically illustrating another semiconductor device according to the embodiment.

FIG. 4 is a cross-sectional view schematically illustrating another semiconductor device according to the embodiment.

In the semiconductor device 111 shown in FIG. 4, the second insulating portion 32 includes a first insulating region 32a and a second insulating region 32b.

The thickness in the Z-axis direction of the second insulating region 32b (the length in the Z-axis direction) is thinner than the thickness in the Z-axis direction of the first insulating region 32a. The direction from the second insulating region 32b to the first insulating region 32a is along the X-axis direction. The fourth partial region 12d is between the first insulating region 32a and the second semiconductor region 11b in the Z-axis direction. The second insulating region 32b is between the third partial region 12c and the first insulating portion 31 in the Z-axis direction. The third partial region 12c is between the second semiconductor region 11b and the second insulating region 32b in the Z-axis direction.

The second insulating region 32b overlaps the third electrode 23 in the Z-axis direction. The first insulating region 32a does not overlap the third electrode 23 in the Z-axis direction. The second insulating portion 32 includes a first step St1. The thickness in the Z-axis direction of the second insulating portion 32 changes in the first step St1.

The first insulating region 32a has a first surface S1 and a second surface S2. The first surface S1 and the second surface S2 cross the Z-axis direction and are along the X-axis direction and the Y-axis direction. The second surface S2 is positioned between the first surface S1 and the second semiconductor layer 12 in the Z-axis direction.

The second insulating region 32b has a third surface S3 and a fourth surface S4. The third surface S3 and the fourth surface S4 cross the Z-axis direction and are along the X-axis direction and the Y-axis direction. The fourth surface S4 is positioned between the third surface S3 and the second semiconductor layer 12 in the Z-axis direction.

The distance in the Z-axis direction between the third surface S3 and the fourth surface S4 is shorter than the distance in the Z-axis direction between the first surface S1 and the second surface S2. The position in the Z-axis direction of the third surface S3 is between the position in the Z-axis direction of the second surface S2 and the position in the Z-axis direction of the first surface S1.

The first step St1 is between the first surface S1 and the third surface S3. For example, there is no step between the second surface S2 and the fourth surface S4. The position in the Z-axis direction of the second surface S2 is, for example, the same as the position in the Z-axis direction of the fourth surface S4.

As shown in FIG. 4, the insulating portion 33 may include a third insulating region 33c and a fourth insulating region 33d. The thickness in the Z-axis direction of the fourth insulating region 33d is thinner than the thickness in the Z-axis direction of the third insulating region 33c. The direction from the third insulating region 33c to the fourth insulating region 33d is along the X-axis direction.

The sixth partial region 12f is between the first semiconductor region 11a and the third insulating region 33c in the Z-axis direction. The fourth insulating region 33d is between the fifth partial region 12e and the first insulating portion 31 in the Z-axis direction. The fifth partial region 12e is between the first semiconductor region 11a and the fourth insulating region 33d in the Z-axis direction. The fourth insulating region 33d overlaps the third electrode 23 in the Z-axis direction. The third insulating region 33c does not overlap the third electrode 23 in the Z-axis direction. The third insulating portion 33 includes a second step St2. The thickness in the Z-axis direction of the third insulating portion 33 changes in the second step St2.

The third insulating region 33c has a fifth surface S5 and a sixth surface S6. The fifth surface S5 and the sixth surface S6 cross the Z-axis direction and are along the X-axis direction and the Y-axis direction. The sixth surface S6 is positioned between the fifth surface S5 and the second semiconductor layer 12 in the Z-axis direction.

The fourth insulating region 33d has a seventh surface S7 and an eighth surface S8. The seventh surface S7 and the eighth surface S8 cross the Z-axis direction and are along the X-axis direction and the Y-axis direction. The eighth surface S8 is positioned between the seventh surface S7 and the second semiconductor layer 12 in the Z-axis direction.

The distance in the Z-axis direction between the seventh surface S7 and the eighth surface S8 is shorter than the distance in the Z-axis direction between the fifth surface S5 and the sixth surface S6. The position in the Z-axis direction of the seventh surface S7 is between the position in the Z-axis direction of the sixth surface S6 and the position in the Z-axis direction of the fifth surface S5.

The second step St2 is between the fifth surface S5 and the seventh surface S7. For example, there is no step between the sixth surface S6 and the eighth surface S8. The position in the Z-axis direction of the sixth surface S6 is, for example, the same as the position in the Z-axis direction of the eighth surface S8.

Based on the results in FIG. 2A and FIG. 2B, the inventors found the following.

The thickness in the Z-axis direction of the first insulating region 32a is thinner than the thickness in the Z-axis direction of the second insulating region 32b. The second insulating portion 32 is provided with the first step St1. Thus, the current collapse can be reduced.

In addition, due to the presence of the second step St2 in addition to the first step St1, the on-resistance of the semiconductor device 111 can be reduced.

The thickness in the Z-axis direction of the second insulating region 32b is desirably not less than 0.05 times and not more than 0.5 times the thickness in the Z-axis direction of the first insulating region 32a. The thickness in the Z-axis direction of the fourth insulating region 33d is desirably not less than 0.05 times and not more than 0.5 times the thickness in the Z-axis direction of the third insulating region 33c.

Figure 5A:
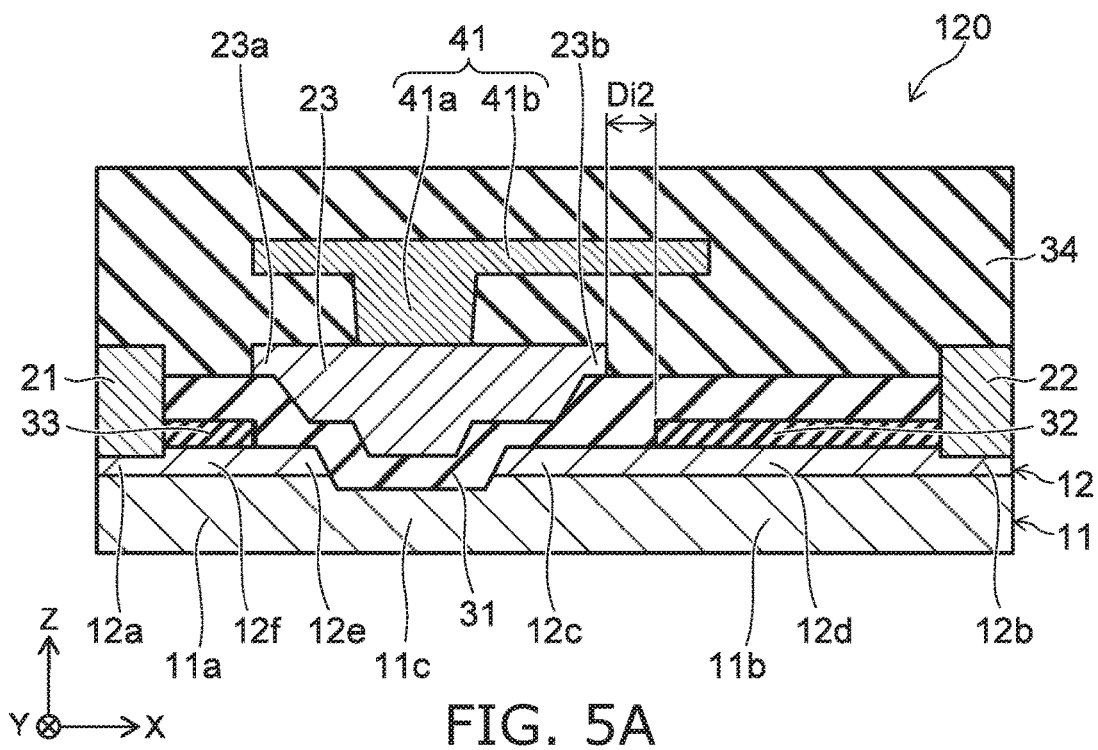
FIG. 5A and FIG. 5B are cross-sectional views schematically illustrating other semiconductor devices according to the embodiment.
Figure 5B:
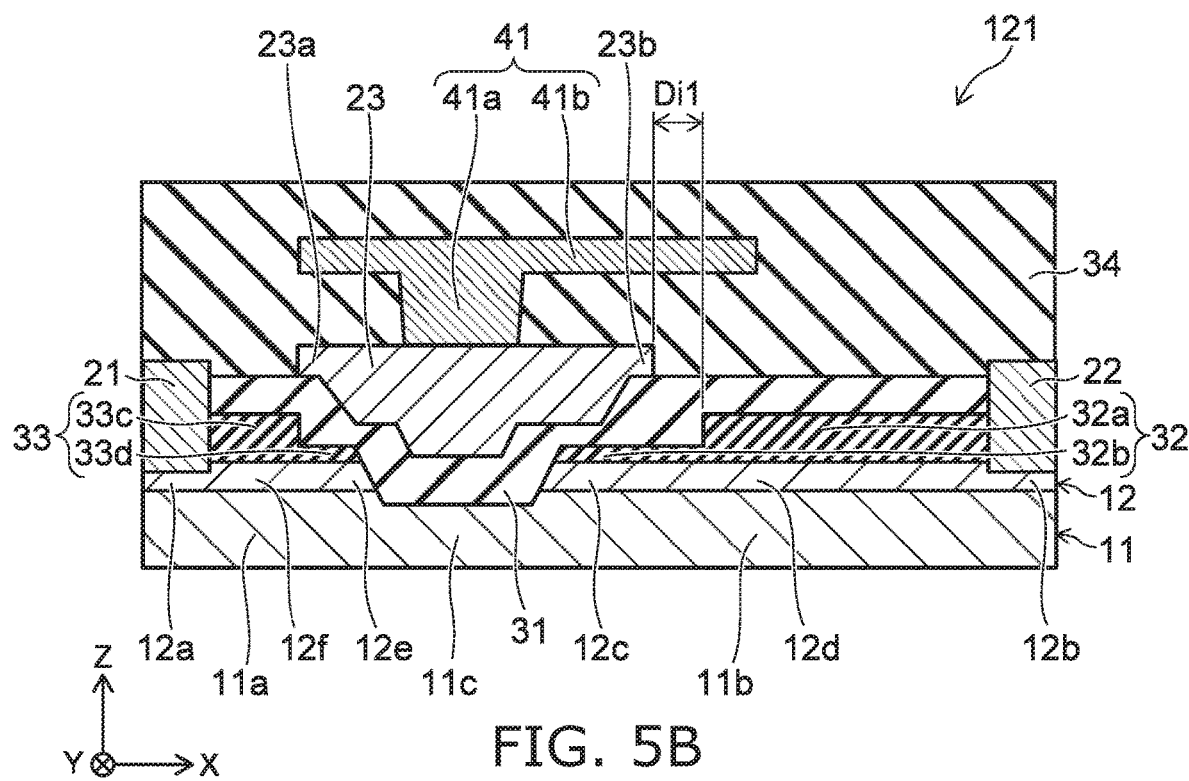

FIG. 5A and FIG. 5B are cross-sectional views schematically illustrating other semiconductor devices according to the embodiment.

In the semiconductor device 120 shown in FIG. 5A, the second insulating portion 32 is away from the third electrode 23 in the X-axis direction. The second insulating portion 32 at least partly overlaps the second conductive region 41b in the Z-axis direction, for example.

The third electrode 23 includes a first end portion 23a and a second end portion 23b. The position in the X-axis direction of the first end portion 23a is between the position in the X-axis direction of the second end portion 23b and the position in the X-axis direction of the first electrode 21. The position in the X-axis direction of the second end portion 23b is between the position in the X-axis direction of the first end portion 23a and the position in the X-axis direction of the second electrode 22. The position in the X-axis direction of the second insulating portion 32 is between the position in the X-axis direction of the second end portion 23b and the position in the X-axis direction of the second electrode 22.

In the semiconductor device 121 shown in FIG. 5B, the first step St1 is away from the third electrode 23 in the X-axis direction. The first step St1 at least partly overlaps the second conductive region 41b in the Z-axis direction, for example. The position in the X-axis direction of the first step St1 is between the position in the X-axis direction of the second end portion 23b and the position in the X-axis direction of the second electrode 22.

The distance Di1 in the X-axis direction between the second insulating portion 32 and the first step St1 is desirably not less than 0.5 μm and not more than 5 μm. The distance Dig in the X-axis direction between the third electrode 23 and the second insulating portion 32 is desirably not less than 0.5 μm and not more than 5 μm.

FIG. 6A, FIG. 6B, FIG. 7A, FIG. 7B, FIG. 8A, FIG. 8B, FIG. 9A, and FIG. 9B are cross-sectional views schematically illustrating other semiconductor devices according to the embodiment.

Figure 6A:
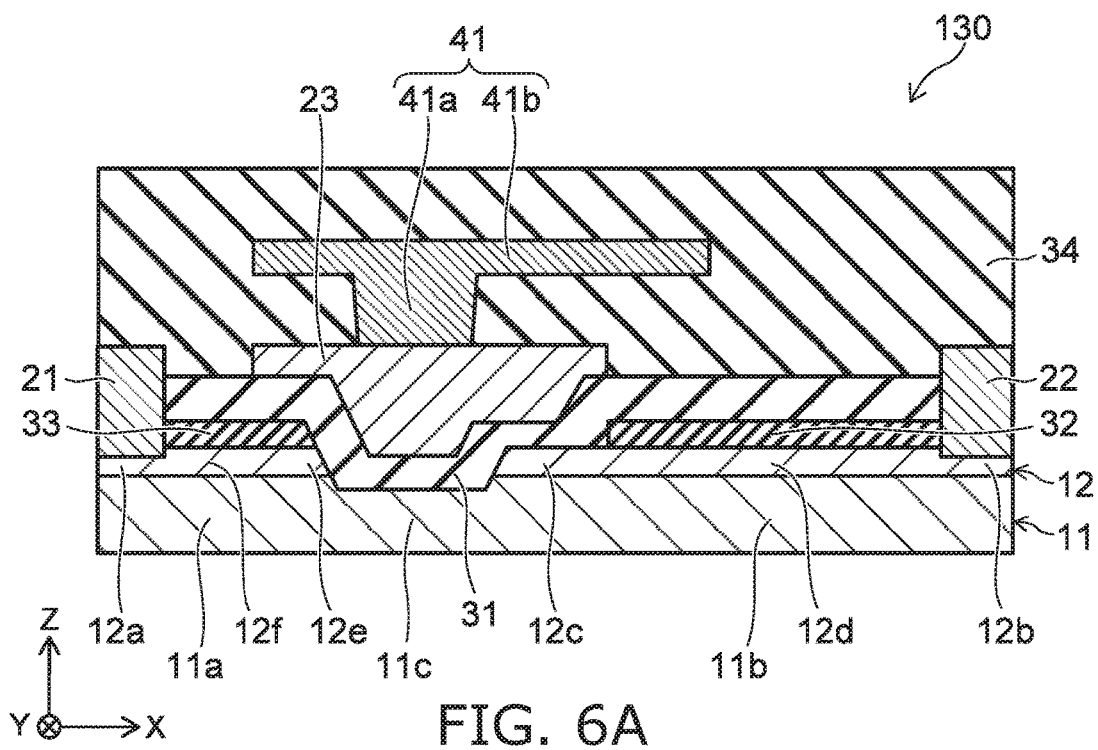
FIG. 6A and FIG. 6B are cross-sectional views schematically illustrating other semiconductor devices according to the embodiment.
Figure 6B:
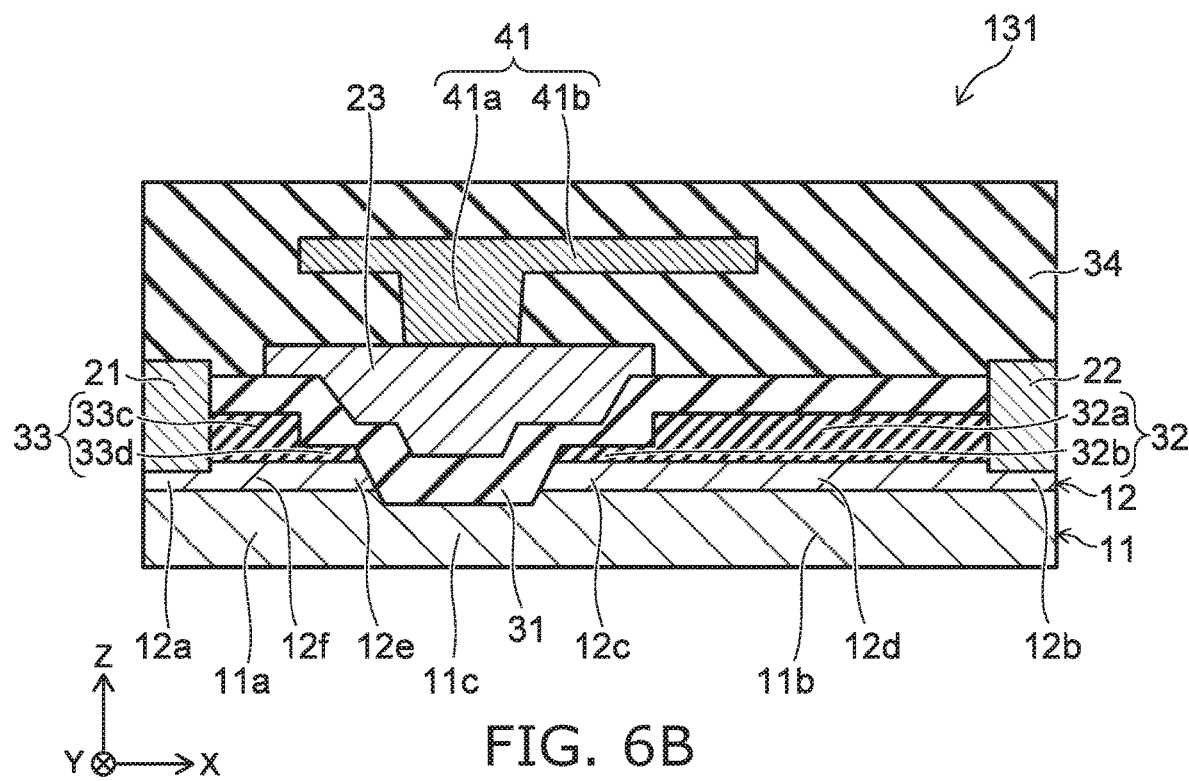

As in the semiconductor device 130 shown in FIG. 6A, a part of the third insulating portion 33 may be provided between the fifth partial region 12e and the third electrode 23 in the Z-axis direction As in the semiconductor device 131 shown in FIG. 6B, a part of the third insulating region 33c may be provided between the sixth partial region 12f and the third electrode 23 in the Z-axis direction.

Figure 7A:
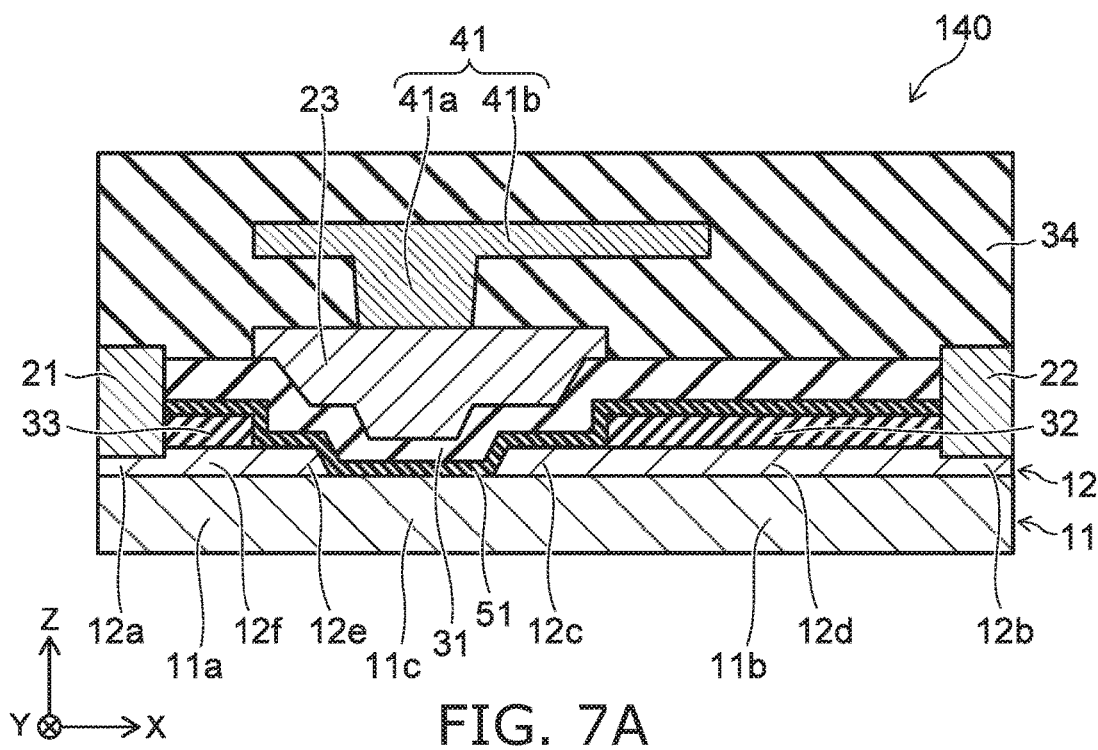
FIG. 7A and FIG. 7B are cross-sectional views schematically illustrating other semiconductor devices according to the embodiment.

The semiconductor device 140 shown in FIG. 7A further includes a first layer 51. The first layer 51 is provided between the first insulating portion 31 and the first semiconductor layer 11 and between the first insulating portion 31 and the second semiconductor layer 12. In the example shown in FIG. 7A, the first layer 51 is further provided between the first insulating portion 31 and the second insulating portion 32 and between the first insulating portion 31 and the third insulating portion 33.

Figure 7B:
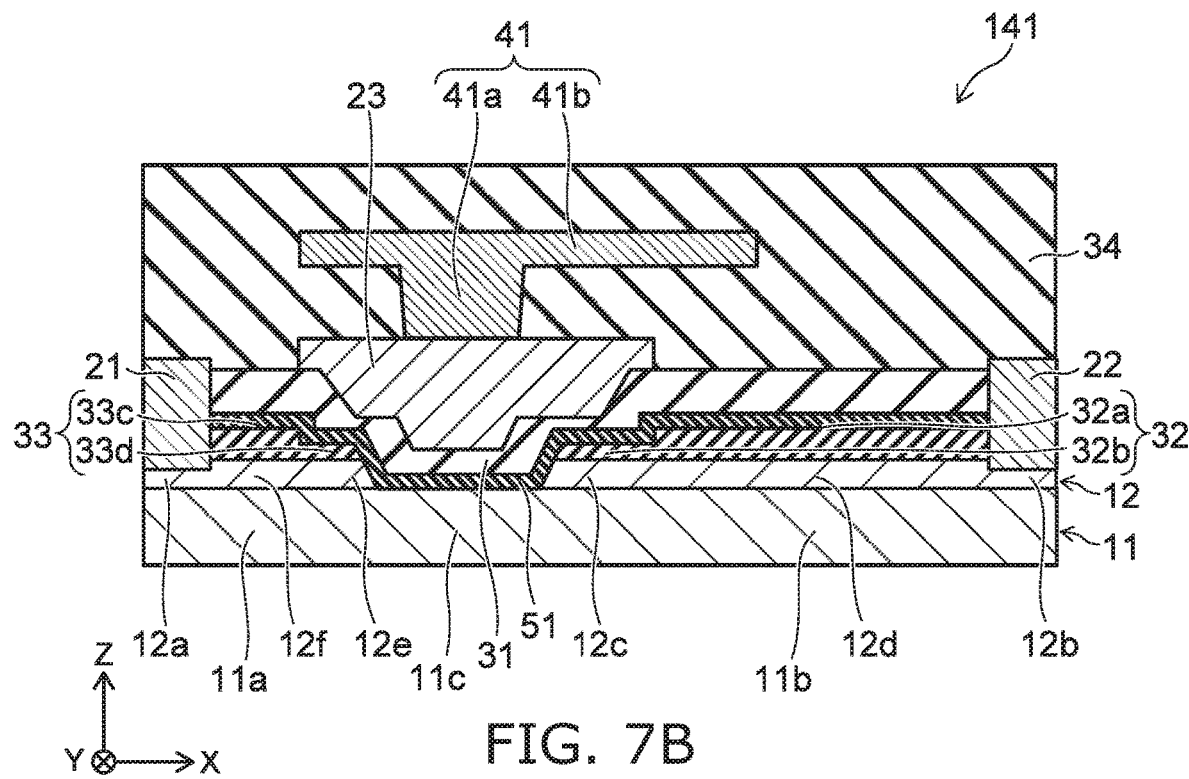

In the semiconductor device 141 shown in FIG. 7B, the first layer 51 is provided between the first insulating portion 31 and each of the first insulating region 32a, the second insulating region 32b, the third insulating region 33c, and the fourth insulating region 33d.

The first layer 51 includes at least one selected from the group consisting of nitrogen and oxygen, and at least any one selected from the group consisting of aluminum and silicon. The first layer 51 includes at least one selected from the group consisting of aluminum nitride, aluminum oxynitride, aluminum gallium nitride, silicon nitride, and silicon oxynitride, for example. Providing the first layer 51 allows the interface state density between the first layer 51 and the third semiconductor region 11c to be reduced, and the fluctuation of the threshold value voltage due to the long-term operation of the device to be suppressed. The film thickness of the first layer 51 is desirably not less than 0.2 nm and not more than 5 nm.

Figure 8A:
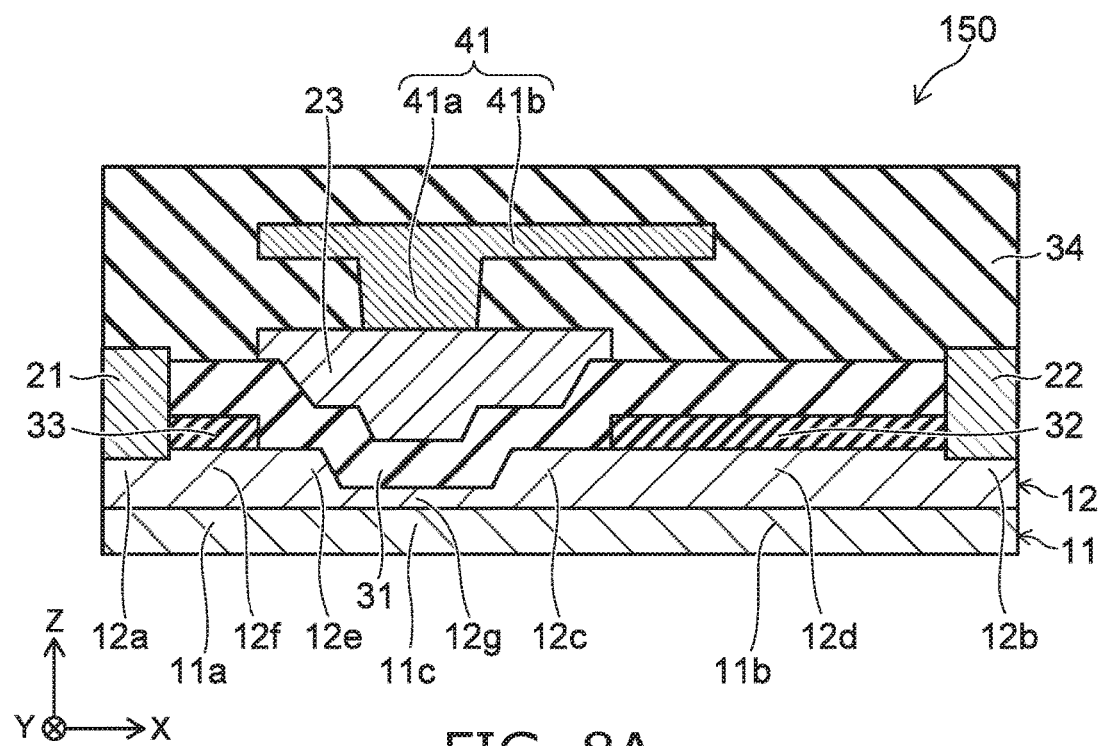
FIG. 8A and FIG. 8B are cross-sectional views schematically illustrating other semiconductor devices according to the embodiment.

In the semiconductor device 150 shown in FIG. 8A, the second semiconductor layer 12 further includes a seventh partial region 12g. The seventh partial region 12g is between the third partial region 12c and the fifth partial region 12e in the X-axis direction. The seventh partial region 12g is positioned between the third semiconductor region 11c and the first insulating portion 31 in the Z-axis direction.

Figure 8B:
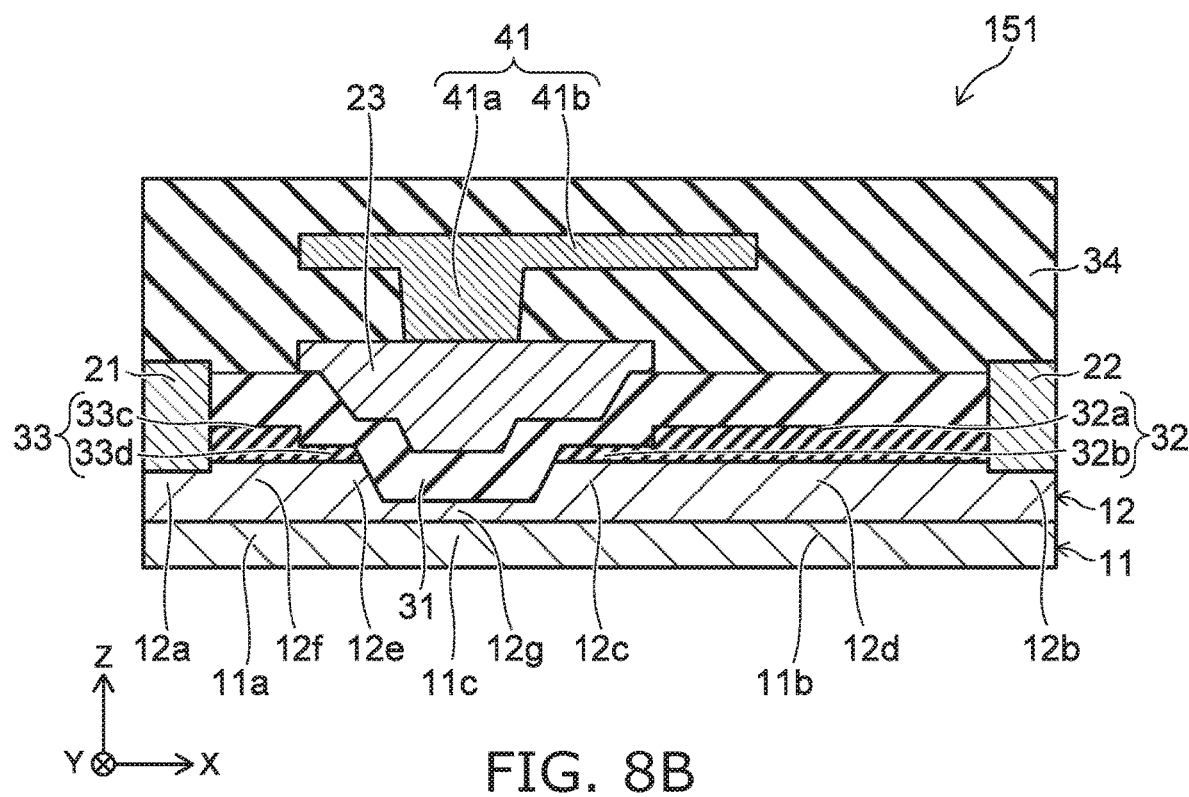

As in the semiconductor device 151 shown in FIG. 8B, the second insulating portion 32 may include a first insulating region 32a and a second insulating region 32b. The third insulating portion 33 may include a third insulating region 33c and a fourth insulating region 33d.

Figure 9A:
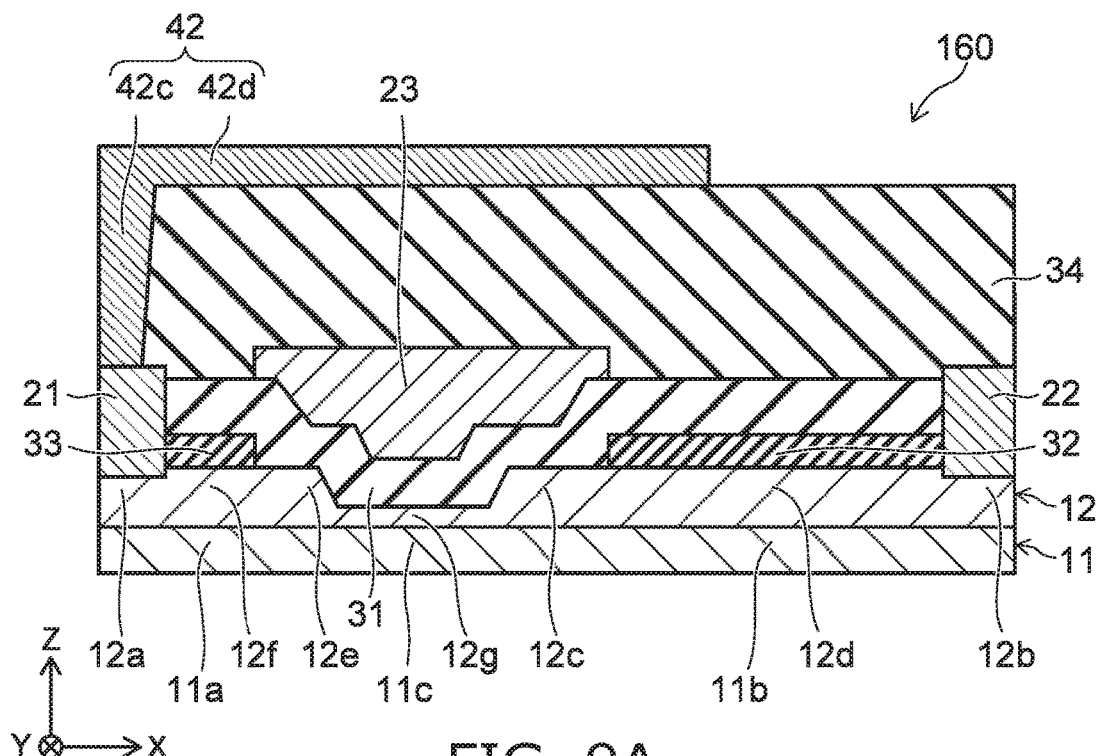
FIG. 9A and FIG. 9B are cross-sectional views schematically illustrating other semiconductor devices according to the embodiment.

The semiconductor device 160 shown in FIG. 9A further includes a second conductive portion 42. The second conductive portion 42 functions as a field plate electrode.

The semiconductor device 160 does not have to include or may include the first conductive portion 41. The second conductive portion 42 is electrically connected to the first electrode 21. The first electrode 21 and the third electrode 23 are positioned between the first semiconductor layer 11 and the second conductive portion 42 in the Z-axis direction. The second conductive portion 42 includes at least one selected from the group consisting of gold, titanium, platinum, copper, and aluminum.

The second conductive portion 42 includes, for example, a third conductive region 42c and a fourth conductive region 42d. The third conductive region 42c is between the third electrode 23 and the fourth conductive region 42d in the Z-axis direction. The length in the X-axis direction of the third conductive region 42c is shorter than the length in the X-axis direction of the fourth conductive region 42d. The third conductive region 42c is connected to the first electrode 21 and the fourth conductive region 42d. The direction from a part of the second insulating portion 32 to a part of the fourth conductive region 42d is along the Z-axis direction. In the Z-axis direction, a part of the fourth insulating portion 34 is between the third electrode 23 and the fourth conductive region 42d and between the first insulating portion 31 and the fourth conductive region 42d.

Figure 9B:
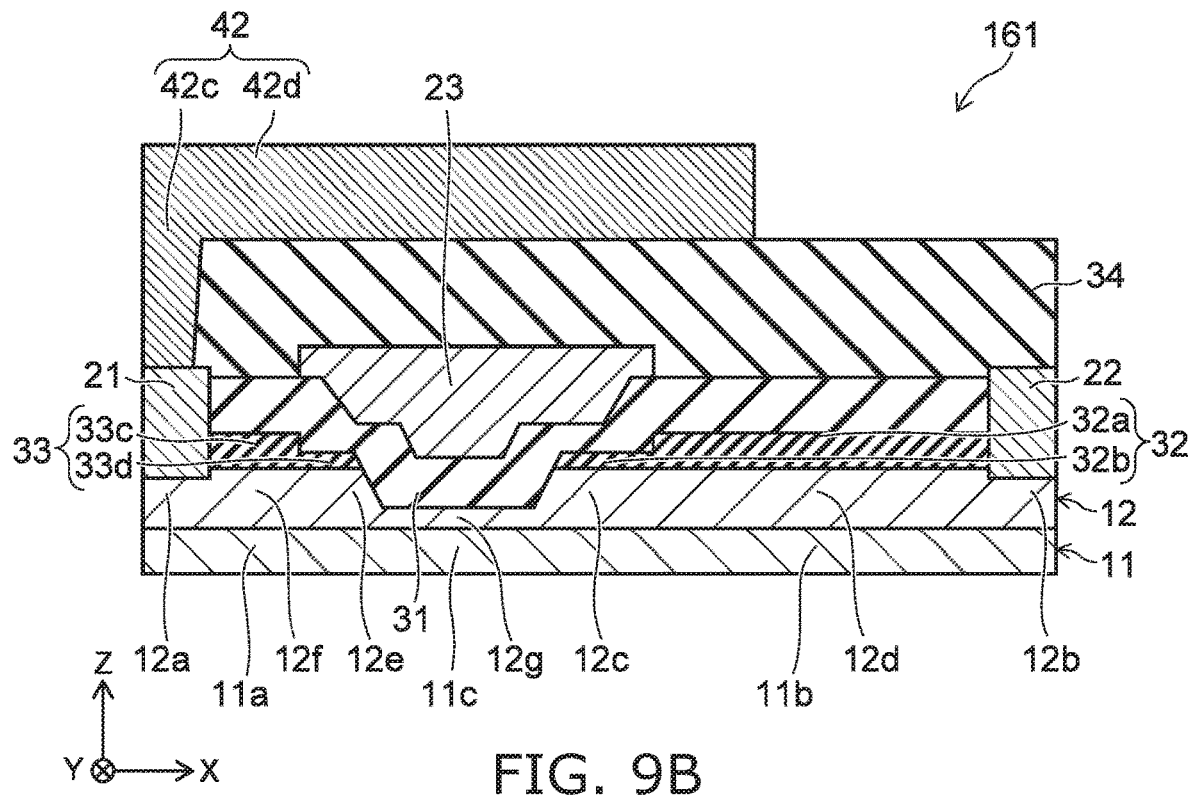

As in the semiconductor device 161 shown in FIG. 9B, the second insulating portion 32 may include the first insulating region 32a and the second insulating region 32b. The third insulating portion 33 may include a third insulating region 33c and a fourth insulating region 33d.

According to each embodiment described above, a semiconductor device capable of reducing current collapse can be provided.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components such as semiconductor layers, insulating portions, electrodes, conductive portions, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor devices practicable by an appropriate design modification by one skilled in the art based on the semiconductor devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device comprising:
a first semiconductor layer including $Al_{x1}Ga_{1-x1}N$ ($0 \leq x1 < 1$), the first semiconductor layer including
a first semiconductor region,
a second semiconductor region, and
a third semiconductor region between the first semiconductor region and the second semiconductor region;
a second semiconductor layer including $Al_{x2}Ga_{1-x2}N$ ($0 < x2 < 1$, $x1 < x2$), the second semiconductor layer including
a first partial region,
a second partial region,
a third partial region between the first partial region and the second partial region,
a fourth partial region between the second partial region and the third partial region,
a fifth partial region between the first partial region and the third partial region, and
a sixth partial region between the first partial region and the fifth partial region,
the first partial region, the fifth partial region, and the sixth partial region overlapping the first semiconductor region in a first direction crossing a second direction from the first semiconductor region to the second semiconductor region, and
the second partial region, the third partial region, and the fourth partial region overlapping the second semiconductor region in the first direction;
a first electrode electrically connected to the first partial region;
a second electrode electrically connected to the second partial region, a direction from the first electrode to the second electrode being along the second direction;
a third electrode, a position in the second direction of the third electrode being between a position in the second direction of the first electrode and a position in the second direction of the second electrode;
a first insulating portion provided between the third semiconductor region and the third electrode and between the third partial region and the third electrode in the first direction; and
a second insulating portion, the fourth partial region being between the second insulating portion and the second semiconductor region in the first direction, and not overlapping the third partial region in the first direction.

2. The device according to claim 1, further comprising a third insulating portion,
the first insulating portion being further provided between the fifth partial region and the third electrode in the first direction,
the sixth partial region being between the third insulating portion and the first semiconductor region in the first direction, and
the third insulating portion not overlapping the fifth partial region in the first direction.

3. The device according to claim 1, wherein a distance in the second direction between the second insulating portion and the third electrode is not less than 0.5 µm and not more than 5 µm.

4. The device according to claim 1, further comprising a first layer provided between the first insulating portion and the first semiconductor layer and between the first insulating portion and the second semiconductor layer,
the first layer including at least one selected from the group consisting of nitrogen and oxygen and at least one selected from the group consisting of aluminum and silicon.

5. The device according to claim 1, further comprising a first conductive portion including a first conductive region and a second conductive region,
the third electrode being between the first conductive portion and the first insulating portion in the first direction,
the first conductive region being between the third electrode and the second conductive region in the first direction,
the first conductive region being connected to the third electrode and the second conductive region,
a length in the second direction of the first conductive region being shorter than a length in the second direction of the second conductive region, and
a direction from a part of the second insulating portion to a part of the second conductive region being along the first direction.

6. The device according to claim 5,
wherein the third electrode includes at least one selected from the group consisting of tungsten, titanium, and molybdenum, and nitrogen, or includes at least one selected from the group consisting of nickel and aluminum, and
the first conductive portion includes at least one selected from the group consisting of gold, titanium, platinum, copper, and aluminum.

7. The device according to claim 1, further comprising a second conductive portion including a third conductive region and a fourth conductive region,
the first electrode and the third electrode being between the second conductive portion and the first semiconductor region in the first direction,
the third conductive region being between the first electrode and the fourth conductive region in the first direction,
the third conductive region being connected to the first electrode and the fourth conductive region,
a length in the second direction of the third conductive region being shorter than a length in the second direction of the fourth conductive region, and
a direction from a part of the second insulating portion to a part of the fourth conductive region being along the first direction.

8. The device according to claim 7,
wherein the first electrode includes at least one selected from the group consisting of titanium and aluminum, and
the second conductive portion includes at least one selected from the group consisting of gold, titanium, platinum, copper, and aluminum.

9. The device according to claim 1, wherein a length in the second direction of the third partial region is not less than 0.5 µm and not more than 5.0 µm.

10. The device according to claim 1, wherein a length in the second direction of the third partial region is not less than 0.035 times and not more than 0.55 times a length in the second direction of the fourth partial region.

11. The device according to claim 1,
wherein the second semiconductor layer further includes a seventh partial region between the third partial region and the fifth partial region, and
the seventh partial region is between the third semiconductor region and the third electrode in the first direction.

12. The device according to claim 1,
wherein the first insulating portion includes at least one selected from the group consisting of oxygen and nitrogen, and any one of silicon and aluminum, and
the second insulating portion includes at least one selected from the group consisting of silicon and aluminum, and nitrogen.

13. A semiconductor device comprising:
a first semiconductor layer including $Al_{x1}Ga_{1-x1}N$ (0≤x1<1), the first semiconductor layer including
  a first semiconductor region,
  a second semiconductor region, and
  a third semiconductor region between the first semiconductor region and the second semiconductor region;
a second semiconductor layer including $Al_{x2}Ga_{1-x2}N$ (0<x2<1, x1<x2), the second semiconductor layer including
  a first partial region,
  a second partial region,
  a third partial region between the first partial region and the second partial region,
  a fourth partial region between the third partial region and the second partial region,
  a fifth partial region between the first partial region and the third partial region, and
  a sixth partial region between the first partial region and the fifth partial region,
  the first partial region, the fifth partial region, and the sixth partial region overlapping the first semiconductor region in a first direction crossing a second direction from the first semiconductor region to the second semiconductor region, and
  the second partial region, the third partial region, and the fourth partial region overlapping the second semiconductor region in the first direction;
a first electrode electrically connected to the first partial region;
a second electrode electrically connected to the second partial region, a direction from the first electrode to the second electrode being along the second direction;
a third electrode, a position in the second direction of the third electrode being between a position in the second direction of the first electrode and a position in the second direction of the second electrode;
a first insulating portion provided between the third semiconductor region and the third electrode and between the third partial region and the third electrode in the first direction; and
a second insulating portion including a first insulating region and a second insulating region,
  a thickness in the first direction of the second insulating region being less than a thickness in the first direction of the first insulating region,
  the fourth partial region being between the second semiconductor region and the first insulating region in the first direction,
  the second insulating region being between the third partial region and the first insulating portion in the first direction, and
  a thickness in the first direction of the second insulating portion changing in a first step.

14. The device according to claim 13,
wherein the third electrode includes a first end portion and a second end portion,
a position in the second direction of the first end portion is between a position in the second direction of the second end portion and a position in the second direction of the first electrode,
a position in the second direction of the second end portion is between a position in the second direction of the first end portion and a position in the second direction of the second electrode, and
a position in the second direction of the first step is between a position in the second direction of the second end portion and a position in the second direction of the second electrode.

15. The device according to claim 13, further comprising a third insulating portion including a third insulating region and a fourth insulating region,
  a thickness in the first direction of the fourth insulating region being less than a thickness in the first direction of the third insulating region,
  the sixth partial region being between the first semiconductor region and the third insulating region in the first direction,
  the fourth insulating region being between the fifth partial region and the third electrode in the first direction, and
  the first insulating portion being further provided between the fourth insulating region and the third electrode in the first direction.

16. The device according to claim 13, wherein a thickness in the first direction of the second insulating region is not less than 0.05 times and not more than 0.5 times a thickness in the first direction of the first insulating region.

* * * * *